United States Patent
Chatel

Patent Number: 5,506,751
Date of Patent: Apr. 9, 1996

[54] EXTRUDED CARD CAGE

[76] Inventor: Louis R. Chatel, The Foot of Crosby St., Lowell, Mass. 01852

[21] Appl. No.: 329,303

[22] Filed: Oct. 26, 1994

[51] Int. Cl.$^6$ ............................................. H05K 7/20
[52] U.S. Cl. ..................... 361/690; 361/704; 361/757; 361/802
[58] Field of Search ............................ 211/41; 361/690, 361/692–695, 704, 705, 707, 711, 727, 741, 756, 757, 796, 802; 439/61–62, 64

[56] References Cited

U.S. PATENT DOCUMENTS

| | | | |
|---|---|---|---|
| 3,723,823 | 3/1973 | Lit et al. | 361/802 |
| 4,519,016 | 5/1985 | Bradley et al. | |
| 4,583,149 | 4/1986 | Ohlenburger | |
| 4,866,576 | 9/1989 | Umetsu et al. | 361/802 |
| 5,024,627 | 6/1991 | Bennett et al. | |
| 5,030,108 | 7/1991 | Babow et al. | |
| 5,032,954 | 7/1991 | Juza | |
| 5,057,968 | 10/1991 | Morrison | |
| 5,103,378 | 4/1992 | Stowers et al. | |
| 5,210,680 | 5/1993 | Scheibler | |

FOREIGN PATENT DOCUMENTS 2230649  10/1990  United Kingdom ................... 361/802

OTHER PUBLICATIONS

RCA "Technical Notes" Publication, No. 939, Sep. 17, 1973, pp. 1–6.

*Primary Examiner*—Gregory D. Thompson
*Attorney, Agent, or Firm*—Pearson & Pearson

[57] ABSTRACT

A card cage for mounting circuit boards comprises lateral panels and an electrically connecting panel extending between the lateral panels. Opposed sets of two spaced rails span the lateral panels and support extruded grille units substantially transverse to the connector panel and the lateral panels to define a cavity for receiving the circuit boards. A plurality of guides formed integrally with each grille unit receive edges of circuit boards inserted in the cavity. Each set of rails and associated grille units define a grille structure of the card cage. A method for forming a grille structure for use in a card cage comprises the steps of forming a support member and support rails. Forming the support member includes extruding a metal piece with a planar portion and a plurality of elongated, U-shaped members carried by the planar portion, cutting the metal piece transverse to the U-shaped members and forming a connecting surface. Forming the support rails includes extruding a metal rail with a receiving structure and cutting the metal rail to form two rails of predetermined length to extend between lateral panels of a card cage. Connecting the opposed connecting surfaces with the receiving structure of the respective supporting rails forms the grille structure.

34 Claims, 2 Drawing Sheets

EXTRUDED CARD CAGE

BACKGROUND OF THE INVENTION

1. Field of the Invention

This invention relates to card cages for mounting circuit boards and more particularly to an improved card cage and grille structure for mounting such circuit boards.

2. Description of Related Art

Card cages, or racks, for mounting printed circuit boards that connect with other circuit boards and electronic components as part of an electronic system are known. They comprise generally a rectangular frame structure forming an enclosure for receiving circuit boards with end panels secured or securable at open ends of the frame. Generally, a rear panel connects to the frame. This rear panel is often referred to as a back plane connector, because it generally provides for the electrical connection between electronic components on circuit boards disposed within the frame and other electronic components forming an electronic system, such as a computer system. Some card cages employ a repositionable front plate or panel in place of such a back panel for making such electrical connections.

The rectangular frame structure of such racks usually include spaced side panels that extend generally parallel with the circuit boards, and opposed, transverse panels that extend between the side panels and generally transverse with respect to both the boards and the side panels. The racks also include guide members for receiving and supporting the circuit boards that are generally secured to or formed integrally with the transverse panels. The transverse panels frequently include apertures between the guides so that they form a grille structure that supports the circuit boards and allows cooling air to pass over the boards.

The following United States Letters Patent disclose racks for mounting circuit boards having board supporting panels:

U.S. Pat. No. 4,519,016 (1985) to Bradley et al. discloses a card cage for mounting printed circuit boards in a stacked relationship with an intermediate frame member in a plane parallel with an upper and bottom frame member. The intermediate frame comprises a single piece of sheet metal with air openings that are punched or stamped pressed through the metal. Guides in the intermediate frame member are then formed by bending portions of the metal in the air openings in an appropriate direction to support circuit boards in both upper and lower frame members to provide a two level rack for mounting circuit boards. The metal working steps required to form guides limits each guide to specific applications and requires significant tooling changes for minor changes, such as the reduction or increase in the numbers of boards to be supported. Additionally, the guides formed by this process are not continuous; that is, the guides only engage a circuit board at a few widely spaced locations.

U.S. Pat. No. 4,583,149 (1986) to Ohlenburger discloses a rack for mounting printed circuit boards. A metal block contacts a heat conducting layer overlying the board. The block or metal components attached to the block provide a metal-to-metal contact with a metal portion of the housing to improve heat transfer from the circuit boards disposed in the rack.

U.S. Pat. No. 4,862,320 (1989) Schmidt et al. discloses a rack for mounting circuit boards that comprises a back panel for electrically engaging boards positioned in the rack. Metal side panels support molded plastic grilles at the top and bottom of the rack. Similarly, U.S. Pat. No. 5,024,627 (1991) Bennett et al. and U.S. Pat. No. 5,030,108 (1991) to Babow et al. disclose a card cage having a general frame structure with guide rails that are formed integrally with the upper frame structure of the cage.

U.S. Pat. No. 5,032,954 (1991) to Juza discloses a housing for electronic components that includes an extruded aluminum, tubular midsection, a front panel, and a die-cast double-domed rear wall. The tubular frame section comprises a single solid piece with no aperture therethrough. It does include integral guides for receiving circuit board edges and grooves for receiving screws to enable attachment of the front panel and the rear panel to form an enclosed card cage. Thus, this patent discloses a one piece, extruded metal, tubular frame with integrally formed lateral panels and board supporting panels. The board receiving aperture formed by the frame is fixed and can receive only a specific number of boards corresponding to the number of guides of a predetermined height corresponding to the orientation of the boards in the card cage. To enable such a card cage to support larger boards or larger numbers of boards requires making a new extrusion fixture.

U.S. Pat. No. 5,057,968 (1991) to Morrison discloses a rack for mounting circuit boards with metal guides that comprise blocks with machined passageways for conducting cooling liquid therethrough. The blocks are individual units that are brazed to form a cooling loop therein. Each guide must be individually formed by brazing blocks together to form the unitary panel. This structure does not provide any capability for air cooling of the components it supports.

U.S. Pat. No. 5,103,378 (1992) to Stowers et al. discloses an enclosure for receiving a card cage for holding circuit cards. A front panel connects to the cards in a commercially available card cage for holding a plurality of printed circuit boards as part of an interchangeable test adaptor.

U.S. Pat. No. 5,210,680 (1993) to Scheibler discloses a card cage having an air cooling system. The card cage comprises a housing having a fan in the bottom, a baffle plate supported above the fan by legs, and guide rails supported on rails respectively. Alternatively, the rails can support a series of baffle plates. The top of the housing includes similar rails supporting counter facing guide rails for supporting circuit boards.

As each of these and other card cages have been developed, a series of desirable features and characteristics have evolved for commercially acceptable card cages. For example, card cages, including the board supporting structures, preferably comprise a relatively strong, durable materials so as to be rugged and reliable in use and suited for a variety of environments. These structures should promote heat dissipation from the circuit boards and electronic components positioned thereon. They should provide adequate support and guidance to circuit boards inserted in the card cage. Additionally, the card cages should be relatively inexpensive to build, maintain and replace.

Likewise, a number of like criteria for the grille structures have developed. Specifically, grille structures should also be formed of a relatively strong materials, facilitate cooling air flow past the circuit boards and provide integrally formed guides for receiving the circuit boards. Advantageously, the grille structures should be formed for use in multiple applications as needed without requiring special tooling or different machinery to reduce the cost of manufacturing such grille structures also well as reduce inventory requirements.

None of the card cages or the grille structures of the prior art satisfy all of these requirements. For example, the commercially available card cages generally have injection molded card guides. Some do have metal portions including grille structures and slots for guiding and supporting circuit boards. However, these structures generally comprise preformed bent sheet metal structures that are constructed for a specific application. Thus, any change in an application requires the use of different tools and/or machines to provide a card cage with such grilles. The Juza patent discloses an extruded frame structure formed as a single tubular piece. In applications that require the housing of boards with greater heights than the card cage or a greater number of boards than the preformed grooves of the card cage require a new part with the associated re-tooling that includes a new extrusion die, and other modifications that can increase production costs significantly.

Card cages for mounting electronic circuit boards have certain common characteristics. Each includes a frame structure generally defining a back plate for electrically connecting with the components on the circuit boards, side panels arranged in a generally parallel fashion with the boards positioned in the cage, and top and bottom members or grilles for supporting guides for receiving and supporting circuit boards in the card gage. Each of the top and bottom members may be provided with cooling passages therein for promoting dissipation of heat generated by the electronic components of the circuit boards positioned in the card cage. However, the size of circuit boards that are mountable in such card cages are variable as are the number of circuit boards that may be used in a particular configuration. Consequently, each application for standard card cages require a separate grille if either or both the number of boards to be supported is different or the length of the boards is different.

SUMMARY

Accordingly, an object of the present invention is to provide an improved grille structure formed of extruded metal for use in constructing a card cage for supporting circuit boards.

Another object of the present invention is to provide grille structures for use in a card cage that are relatively strong and reliable.

Still another object of the present invention is to provide grille structures formed of individual components that enable the formation of grille structures of various lengths and widths with relative ease.

Yet another object of the present invention is to provide a grille structure that is both simple to make and to install to form a card cage.

Still another object of the present invention is to provide a card cage formed by securing extruded panels together with an extruded grille structure that is rugged and durable.

Yet still another object of the present invention is to provide a card cage formed of components that can be readily fabricated for a variety of sizes and applications.

A further object of the present invention is to provide a relatively simple and inexpensive method for making grille structures that are of varying sizes according to the application.

According to one aspect of this invention, grille structures for use in a card cage comprise first and second sets of two spaced, elongated structural members for extending between and securing to side structural members. Each set supports a planar base of an integrally extruded, circuit board support member having a plurality of U-shaped guide members carried by the planar base. Each U-shaped guide member forms a registered set with a guide member of the other support member upon installing the grid structures in a card cage.

According to another aspect of the present invention, a card cage for mounting circuit boards comprises side panels and a connector panel therebetween for electrically interconnecting the circuit boards. First and second sets of two spaced rails span the side panels transverse to the connector panel so that the side panels and the rails define a cavity for receiving the circuit boards. A plurality of guide means formed integrally with each grille unit receive edges of circuit boards inserted in the cavity.

In accordance with still another aspect of this invention the method for forming a grille structure for use in a card cage comprises the steps of forming a support member and support rails. Forming the support member includes extruding a member of indeterminate length with a base planar portion and a plurality of spaced members with each extending perpendicularly from said base portion parallel to the extrusion axis and terminating with a groove in a free edge thereof. The member is then cut transversely to the extrusion axis and a connecting surface is formed at opposed ends to define a support unit. Forming the support rails includes extruding a metal rail with a receiving structure and cutting the metal rail to form two rails of predetermined length to extend between lateral panels of a card cage. The opposed connecting surfaces of the support member connect with the receiving structure of the respective supporting rails to form the grille structure.

In a further aspect of this invention a card cage for mounting circuit boards includes two opposed, extruded metal card holders. Each holder has a planar base that supports a plurality of circuit board guides that, in turn, engage an edge of the circuit boards to thereby support the circuit boards in the card cage. Opposed ends of each of first and second rails of two sets of such rails connect to opposed side panels. The first and second rails of each set support opposed ends of one of the metal card holders whereby the side panels, the sets of rails, the metal card holders, define the structure for supporting circuit boards.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

DESCRIPTION OF ILLUSTRATIVE EMBODIMENTS

Figure 1:
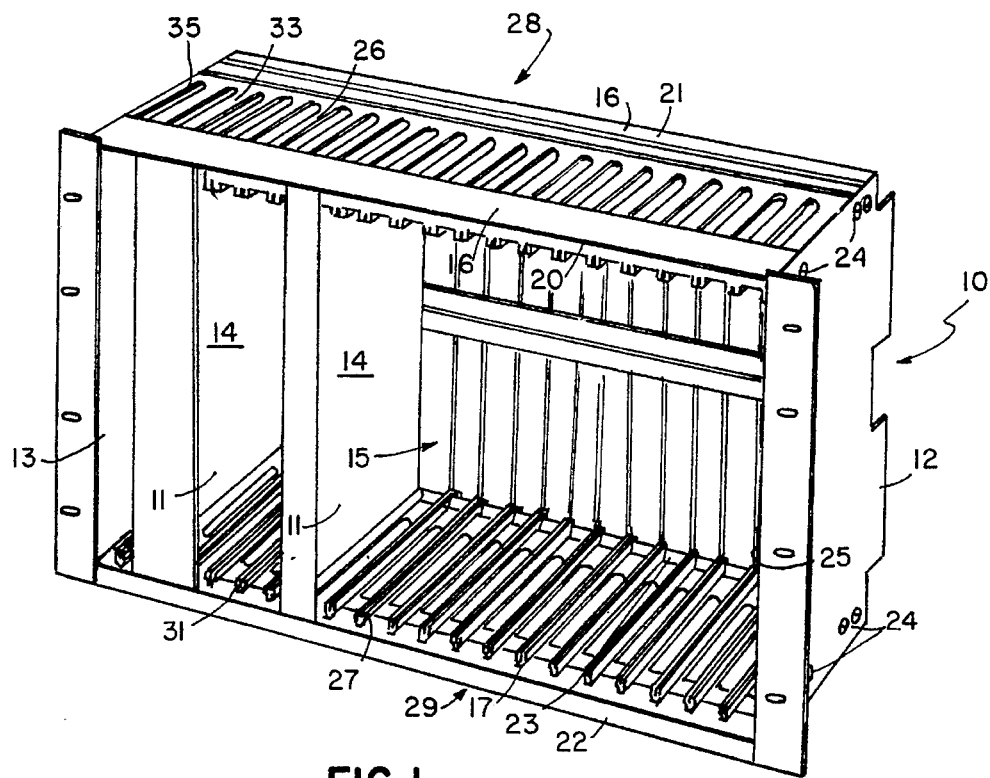
FIG. 1 is a perspective view of a card cage for mounting circuit boards according to the present invention.

FIG. 1 depicts an illustrative rack or card cage 10 for removably positioning printed circuit boards 11 according to this invention. The card cage 10 includes spaced, opposed lateral or side panels 12,13 that are substantially parallel with planar surfaces of the printed circuit boards (e.g., 14) positioned in the cage. It will be understood that these panels may be solid or open-frame structures. A connector panel 15 extends transversely to the side panels 12, 13 and defines a back plane of the card cage. The connector panel 15 provides electrical connections between electronic components (e.g. 14') on the printed circuit boards 14 positioned in the card cage with other electronic components that may be on such circuit boards or at remote locations.

Two sets 16,17 of two spaced, substantially co-planer support rails 20,21 and 22,23, respectively, span the space between and are secured to the side panels 12,13 by machine screws, such as screws 24. The rails 20,21 and 22,23 of each of the sets 16,17 define spaced planes substantially parallel to one another and substantially transverse to the planes defined by the connector panel 15 and the side panels 12, 13. The rails 16, 17, side panels 12, 13, and the connector panel 15 thereby define a cavity 25 for receiving the printed circuit boards 11 for connection with the connector panel 15.

Figure 2:
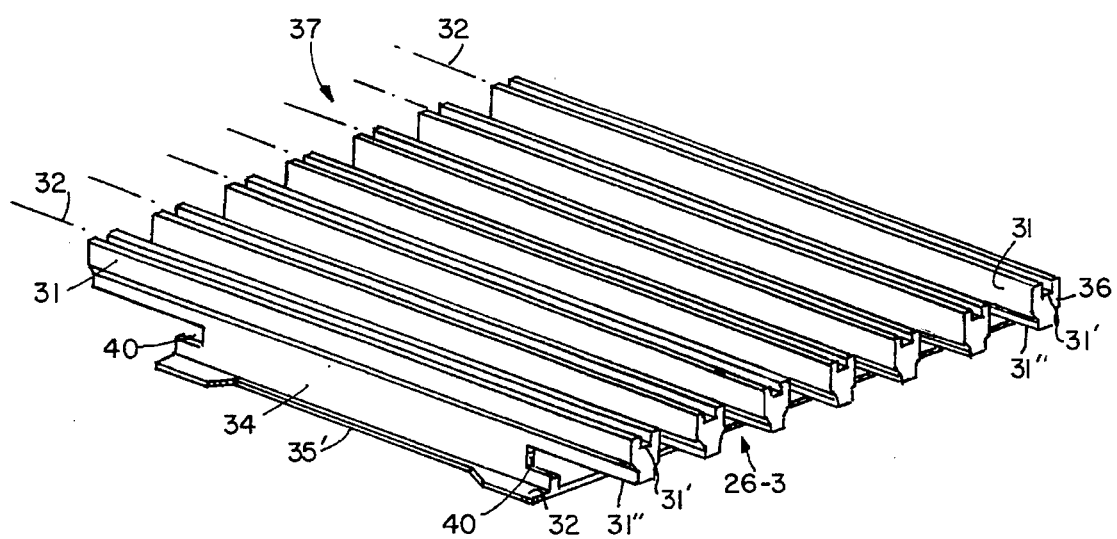
FIG. 2 is a perspective view of a grille structure of the card cage of FIG. 1 with a portion of a surface coating broken away.
Figure 3:
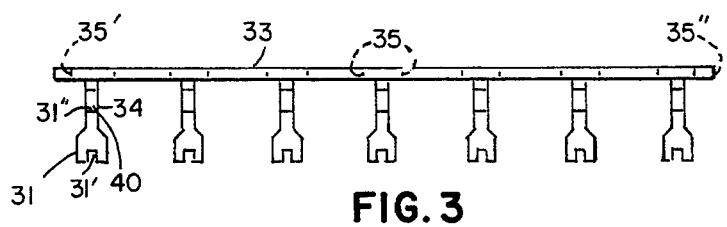
FIG. 3 is a front elevation of the grille structure of FIG. 2.

Referring now to FIGS. 1, 2, and 3, the support rails 20,21 and 22,23, respectively, carry each of the board supporting structures or grille elements 26 and 27 so that the associated rails and grille elements define grille assemblies or structures 28 and 29. The grille structures 28, 29 comprise the top and bottom of the card cage 10 with the circuit boards 14 vertically positionable therebetween.

Each of the grille elements 26, 27 comprises one or more extruded metal grille units. In FIG. 1, the grille elements 26 and 27, each comprise three grille units 26-1, 26-2, and 26-3 and units 27-1, 27-2, and 27-3, respectively, with the individual grille units of the grille element 26 being oppositely supported from the corresponding grille units of the grille element 27.

Each of the grille units in the grille elements 26, 27, as depicted in FIG. 3 with respect to grille element 26-3, has a plurality of guide means, such as U-shaped members 31, formed integrally therewith and extending along a support axes 32. The U-shaped members 31 of each of the grille units of the grille element 26 registering with corresponding opposed ones of the grille units 30 of the grille element 27 to form registered sets of U-shaped members for supporting circuit boards positioned in the cavity 25. Thus, the registered sets are adapted to receive opposed edges of a circuit board (e.g. 11) in an open portion of the U-shaped members 31'. This enables a user to insert and guide such circuit board into position for connection with the connector panel 15 whereby electronic components (e.g. 14') are electrically connected with other electronic components to form an electronic system.

The grille unit 26-3 depicted in FIGS. 2 through 5 like the other grille units 26-1, 26-2, 27-1, 27-2, and 27-3, comprises a base or planar member 33 positioned opposite the open end 31' of the U-shaped members 31. A plurality of extension members 34 extend between each closed end 31" of the plurality of U-shaped member 31 and the planar member 33 such that the U-shaped members 31 are supported by the planar member 33. The planar member 33 further includes central apertures 35 and aperture portions 35' and 35". The aperture portions 35' and 35" are preferably complementary so that abutting grille units (e.g., grille units 26-1 and 26-2 of FIG. 1) have an aperture formed therebetween by the aperture portions 35' and 35" corresponding in size to one of the apertures 35.

The ends of the U-shaped members 31 define opposed ends, like ends 36 and 37 of the unit 26-3 of the grille units 30, that lie along lines that are transverse to the axes 32. The grille unit 26-3 like the other grille units has J-shaped notches 40 that define a connecting surface and that extend inwardly from the ends 36 and 37 along each of the U-shaped members 31.

Figure 4:
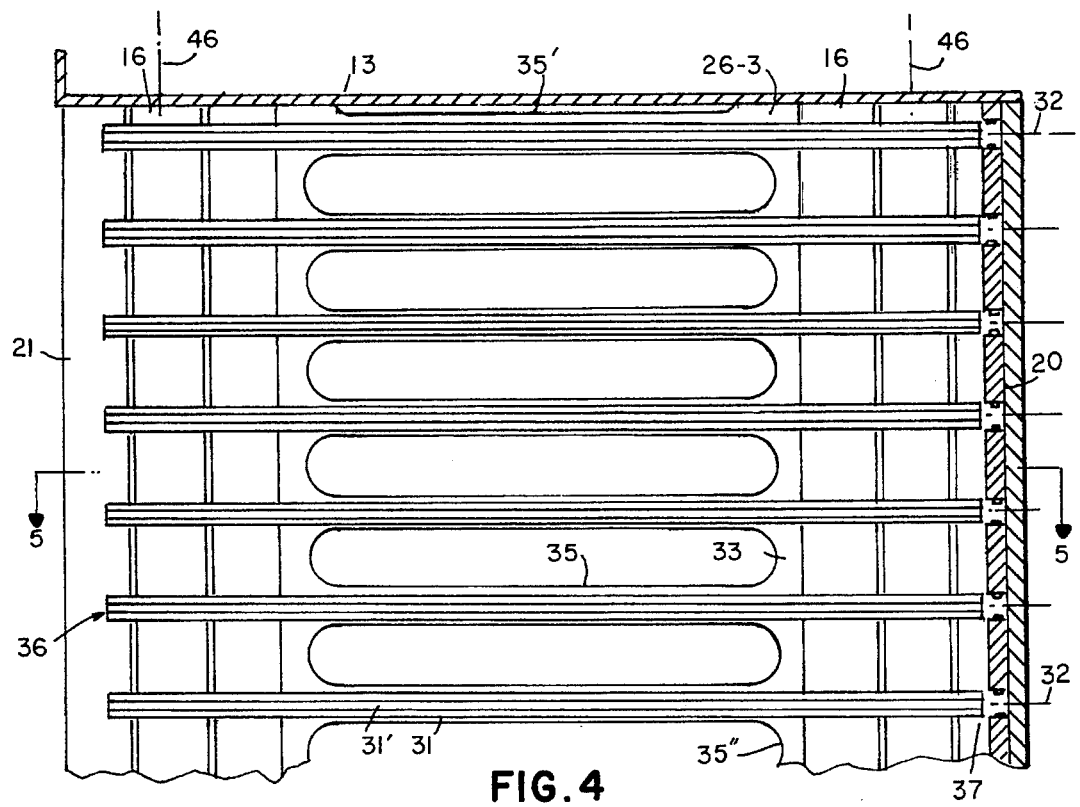
FIG. 4 is a bottom partial sectional view of the top of the card cage of FIG. 1 with a portion of a surface coating on one support rail broken away.
Figure 5:
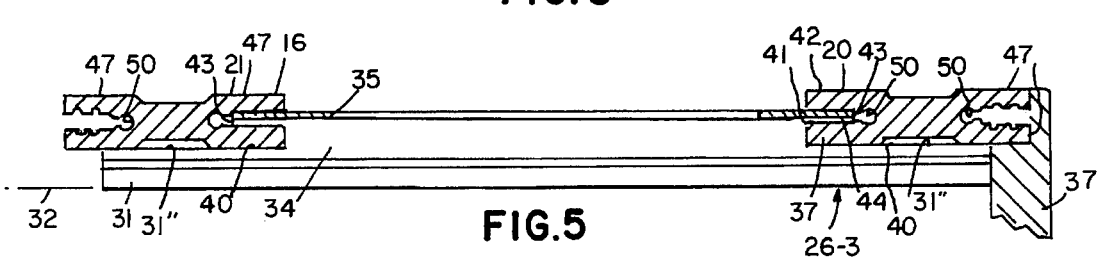
FIG. 5 is a sectional view taken along the line 5—5 of FIG. 4.

As depicted in FIGS. 4 and 5 the rails 20 and 21 support the unit 26-3 by a receiving structure comprising extended, slightly tapered arms 41 and 42 that define a slot 43. The slot 43 receives the smaller projection 44 of the J-shaped notches 40 with the closed end 31" of the U-shaped members abutting the outer portion of the arm 41. Thus, as depicted in FIG. 5, edges of the planar member 33 of the units 26-3 are disposed in the slots 43 so that an upper surface of the planar member 33 engages the inner surface of the tapered arm 42.

Figure 6:
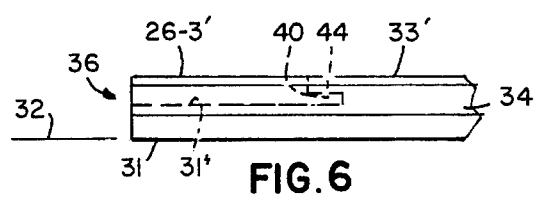
FIG. 6 is a partial side view of an extruded grille structure according to the present invention prior to machining.

The grille units, such as grille unit 26-3, are preferably formed by extruding aluminum along the axes 32 of the U-shaped members 31 (FIG. 2), machining such units to provide the J-shaped notches 40 and the apertures 35, 35' and 35", and then coating the grille unit with a powdered epoxy finish 26A overlying the aluminum surface 26B. This finish enables such grille units to be electrically insulating while the extruded nature of the grille units enables such units to be formed of various lengths for supporting circuit boards of corresponding sizes without retooling. Specifically with reference to FIG. 6, a stock piece of aluminum, or other extrudable metal 45, is extruded along the axes 32 with the U-shaped members 31, a solid base or planar member 33', and extensions 34'. The extruded metal piece 45 is then cut transversely to the axes 32 to a desired length to define a rough grille unit 26-3' having the opposed ends 36 and 37 of which only the end 36 is seen in FIG. 6. Machining and/or cutting the rough grille unit 26-3' from the opposed ends such as along the phantom line 46 defines the J-shaped notches 40, while cutting or machining apertures in the base member 33' defines the planar member 33 with the apertures 35, 35' and 35" of FIG. 3.

Grille units formed by an extrusion tool will have a predetermined number of U-shaped members. It will now be appreciated that the use of the rough grille units 26-3' of FIG. 6 to form grille units, like the grille unit 26-3 of FIGS. 3 and 4, enable the formation of grille elements, like the grille elements 26 and 27 of FIG. 1, for mounting selected numbers of circuit boards without retooling. For example, the grille units 26-3 of FIGS. 3 and 4 are formed by an extrusion tool with seven (7) U-shaped members. By cutting such grille unit through the planar member 33 transverse to the ends 36 and 37 and spaced from adjacent U-shaped members forms two partial grille units having between one and six U-shaped members each. Preferably the cut through the planar member is take so as to form aperture portions 35" and 35' on opposed sides of the cut. Thus, by using one of such partial grille units alone or with full grille units enables formation of grille elements like the elements 26 and 27 of FIG. 1 with selected numbers of U-shaped members without retooling.

Referring now to FIGS. 4 and 5, the rails, such as rail 20, are also preferably formed by extruding a similar aluminum material along an axis 46 with the arms 41 and 42 defining the slot 43. The piece is then cut transversely to the axis 47 to a desired length and the piece is then preferably coated with an epoxy powdered finish 21A overlying the aluminum surface 21B. The length of the cut rail corresponds to the grille elements 26, 27 comprising one or more grille units and/or portions thereof to be supported between the rails. The extruded rails also preferably include arms 47 defining an elongated aperture 50 sized and formed with thread surfaces for receiving the screws 24 (see FIG. 1) passing through the side panels 12, 13 to secure the rails to the card cage 10.

Thus, the present invention enables forming grille elements, like the grille elements 26, 27, comprising one or more grille units and/or portions thereof for supporting a selected number of circuit boards. The rails, like the rails 20 and 21, can also be correspondingly sized for supporting such grille elements to define grille structures like the structure 28 and 29. Simply by arranging the number and length of grille units and/or portions of grille units and by providing rails of corresponding length a wide variety of sizes of card cages can be formed according to the size of the connector and side panels so that such card cages can be constructed for holding desired numbers and sizes of circuit boards as needed without retooling for forming the grille structures.

It will be understood that grille units formed in accordance with the present invention however can not alter the spacing between the U-shaped members without retooling so that, if a denser or sparser spacing of circuit boards in the card cage to be constructed is desired, the extrusion form must be correspondingly changed. Fortunately, the spacing between the circuit boards defined by commercially available back panels are generally one of several standard spacings between boards so that by having several standard extrusion configurations of the grille units enables forming grille elements like the elements 26 and 27 without retooling and without requiring excessive inventories.

Furthermore, in view of the co-pending U.S. patent application, Ser. No. 08/231,617, titled "Front Panels For Rack-Mounted Printed Circuit Boards" incorporated by reference herein, it will also be understood that the majority, if not all the components forming a card cage made in accordance with the present invention can be formed of extruded metal components (e.g., the side panels). It is noted that non-extruded components, may also be used with the grille elements or the grille structures of the this invention to construct card cages for mounting circuit boards.

Thus, this invention provides grille elements and grille structures formed of extruded metal that are strong and reliable and that are simple to make and install as part of a card cages for supporting circuit boards. Grille elements according to the present invention also provide metal surface contact with circuit boards for improved heat transfer. Further the grille structures, being formed of individual, modular, components can be constructed easily with various lengths and widths.

Thus, in summary, the present invention describes an improved grille structure for use in the fabrication and construction of card cages that comprises an extruded metal grille unit supported by a set of rails that are preferably extruded metal as well. The rails and grille unit define a grille structure that, with an opposed grille structure are supportable between side panels to define a cavity of a card cage for supporting circuit boards. The structure of the rails and the grille unit enables relatively simple procedures to form such grille structures for supporting circuit boards of different sizes and various numbers without retooling and maintenance of excessive inventory of components. That is, grille structures of desired lengths can be constructed without retooling or maintenance of large inventories of such various components required by the prior art.

This invention has been disclosed in terms of certain embodiments. It will be apparent that many modifications can be made to the disclosed apparatus without departing from the invention. Therefore, it is the intent of the appended claims to cover all such variations and modifications as come within the true spirit and scope of this invention.

What is claimed as new and desired to be secured by Letters Patent of the United States is:

1. Grille structures for use in a card cage for mounting circuit boards for electrically connecting electronic components on such circuit boards with other electronic components to comprise an electronic system, the card cage being of the type having spaced side panels which are substantially parallel with circuit boards mounted in the card cage, said grille structures comprising:

A. first and second sets of two spaced, elongated structural members adapted for extending between and securing to the side panels of the card cage, B. first and second circuit board support member supported between said two structural members of each of said sets, respectively, to define two of said grille structures, each of said support members comprising an extruded member with a planar base extending between said two structural members of one of said sets, a plurality of extension members extending from said planar base and a plurality of U-shaped guide members extending from said extension members transversely to said structural members, each of said guide members of said first support member adapted to form a registered set with an opposed guide member of said second support member in a card cage in which said grille structures are mountable so as to engage opposed edges of a circuit board and to support thereby a circuit board inserted into the card cage.

2. Grille structures as recited in claim 1 wherein each of said two structural members of each of said sets has an elongated slot therein for receiving an edge of said planar base with portions of said U-shaped members extending along an outer surface of said structural member whereby said support members are supported between said first and second two structural members of each of said sets.

3. Grille structures as recited in claim 2 wherein each of said support members further comprise a plurality of extension members extending from said planar base for supporting said U-shaped members wherein said support members are formed of an extruded metal.

4. Grille structures as recited in claim 2 wherein each of said planar bases has a plurality of apertures therein for enabling air flow around a circuit board inserted into a card cage in which said grille structures are mountable.

5. Grille structures as recited in claim 2 wherein said support members are substantially electrically insulating and thermally conductive.

6. Grille structures as recited in claim 1 wherein each of said elongated structural members is formed of an extruded material, 7. Grille structures as recited in claim 1 wherein each of said elongated structural members is formed of an extruded metal with a slot which extends along a longitudinal axis of each of said structural members and each of said support members has opposed notches formed therein for engaging said elongated structural members such that the portion of said planar base forming said notch is disposed within said slot and said U-shaped members extend along a surface of said structural member spaced from said slot.

8. Grille structures as recited in claim 1 wherein said planar base of each of said support members has apertures therein for enabling coolant flow through circuit boards supported in said guide members.

9. Grille structures as recited in claim 1 wherein each of said circuit board support members comprises a plurality of integrally extruded, metal units.

10. An improved card cage for positioning printed circuit boards therein, said card cage comprising:
   A. spaced, opposed side panels that are substantially parallel with the circuit boards;
   B. a connector panel between said side panels defining a back of the card cage for electrically interconnecting the circuit boards;
   C. first and second sets of two spaced rails that span said side panels with each of said sets being in a plane substantially transverse to the connector panel thereby defining with said side panels a cavity for receiving the circuit boards;
   D. an extruded grille unit supported between said spaced rails of each set with each of said grille units having a planar base, a plurality of extension members extending from the base and a plurality of guide means carried by said extension members for supporting and guiding the circuit boards inserted into said cavity whereby the circuit boards are positioned for connection with said connector panel.

11. An improved card receiving assembly as recited in claim 10 wherein said grille units are integrally extruded metal grille units.

12. An improved card receiving assembly as recited in claim 10 wherein each of said rails is an extruded rail.

13. An improved card receiving assembly as recited in claim 10 wherein each of said rails is formed as an integrally extruded metal rail and each of said grille units is formed as an integrally extruded metal grille unit.

14. An improved card receiving assembly as recited in claim 10 wherein said grille units have apertures formed therein and disposed on opposed sides of each of said guide means for enabling flow of a coolant fluid through said grille units.

15. An improved card receiving assembly as recited in claim 14 wherein said plurality of guide means comprise a plurality of U-shaped members such that each of said U-shaped members of one of said grille units form a registered set with one of said U-shaped member of said other of said grille units whereby each of the circuit boards positioned in said card cage is supported in one of said registered sets of said U-shaped members.

16. An improved card receiving assembly as recited in claim 15 wherein said apertures extend through said planar bases of each of said grille units.

17. An improved card receiving assembly as recited in claim 16 wherein each of said grille units further comprises a plurality of extension members extending from said planar surface such that each of said U-shaped members connects with said planar surface through said extension members.

18. An improved card receiving assembly as recited in claim 16 wherein each of said rails is extruded rails formed with an elongated slot for receiving an edge of said planar base of one of said grille units whereby each of said grilles units is supported between one of each of said sets of said rails along opposed edges of said planar base.

19. An improved card receiving assembly as recited in claim 18 wherein each of said elongated rails is formed with second elongated slot opposed to said first slot for receiving a threaded portion of a screw extending from the side panels to thereby secure each of said rails to and between said side panels.

20. An improved card receiving assembly as recited in claim 28 wherein said U-shaped members extend beyond the edges of said planar base with a base surface of said U-shaped members engaging an outer surface of said rail members and said side panels are formed as a unitary piece of extruded metal.

21. A method for forming a grille structure for use in a card cage for electrically connecting electronic components on circuit boards supported in the card cage with other electronic components, the card cage being of the type having spaced, substantially parallel side panels spanned by opposed ones of said grille structures and a back plane conductor, said method comprising the steps of:
   A. forming a support member including
      i. extruding from an extrudable material and along an extrusion axis a member of indeterminate length having a planar portion and a plurality of spaced members extending perpendicularly from said base portion and parallel to the extrusion axis, each spaced member terminating with a groove in a free edge thereof said adapted to receive an edge of a circuit board to be supported by the grille structure;
      ii. cutting the extruded member transverse to the extrusion axis at a predetermined location corresponding to the length of the circuit board to be supported by the grille structure, said cutting step defining a support member with first and second ends transverse to the axis,
      iii. forming a connecting surface at the first and second ends of the structural member;
   B. forming support rails comprising:
      i. extruding from an extrudable material along a second extrusion axis a rail element of indeterminate length,
      ii. forming a receiving structure in said rail element, and
      iii. cutting the rail element transverse to said second axis so as to form two support rails of predetermined length to extend between side panels of a card cage; and
   C. connecting the support member with the support rails with each of the receiving structures of the two support rails receiving one of the support surfaces of the support member such that the rails and support structure are engaged to form the grille structure.

22. A method for forming grille structures as recited in claim 21 further comprising the step of coating the structural member with an electrically insulating and thermally conductive surface wherein the extrudable material of said step of extruding the member is a metal material.

23. A method for forming grille structures as recited in claim 21 further comprising the step of coating the support rail wherein said step of extruding the rail element includes extruding the rail element from a metal material.

24. A method for forming grille structures as recited in claim 21 further comprising the step of forming apertures in said planar portion for enabling flow of a coolant fluid through said grille structure for cooling the circuit boards.

25. A method for forming grille structures as recited in claim 21 wherein said step of extruding the member further includes forming a plurality of elongated extensions linearly coextensive with the planar base and the spaced members with each of the extensions extending between the planar member and the portion opposite the groove in the spaced members.

26. A method for forming grille structures as recited in claim 25 wherein said step of forming a connecting surface includes removing from the first and second ends of the support structure a portion of the planar base portion and the extension overlaying the spaced members and removing a portion of the extension intermediate the planar base portion and the spaced members thereby forming a J-shaped notch at the first and second ends of the support structure and said step of extruding the rail element includes forming a slot therein thereby comprising said step of forming the receiving structure.

27. A card cage for mounting circuit boards for electrically connecting electronic components on such circuit boards with other electronic components to form an electronic system, said card cage comprising:
   A. means for electrically interconnecting the circuit boards;
   B. two opposed, extruded metal card holders comprising:
      i. a planar base,
      ii. a plurality of extension members extending said base,
      iii. a plurality of circuit board guides supported by said said extension members, each of said guides for engaging an edge of a circuit board opposed to an edge engaged by one of said guides of said other card holder whereby said card holders support circuit boards disposed therebetween for interconnection through said interconnecting means;
   C. two sets of first and second spaced rails, each of said sets supporting one of said card holders between said first and second spaced rails with said sets defining spaced, parallel planes; and
   D. spaced, side panels connected to said connecting means and each of said rails of said two sets with each of said panels extending substantially parallel to circuit boards supportable by said guides to thereby define a structure for supporting circuit boards.

28. A card cage as recited in claim 27 wherein each of said metal card holders is formed by cutting a length corresponding to the length of the circuit boards from an extruded metal member of indeterminate length, said extruded metal member being extruded along an extrusion axis having said planar base portion and said plurality of said guides with said guides extending along said extrusion axis.

29. A card cage as recited in claim 28 wherein said length of said metal member is cut transverse to said extrusion axis and is machined to form support surfaces on opposed sides of said length of said metal member to thereby define said card cage.

30. A card cage as recited in claim 29 wherein said rails are formed by cutting lengths of an extruded metal element of indeterminate length extruded along a second extrusion axis.

31. A card cage as recited in claim 27 wherein said rails are formed by cutting predetermined lengths corresponding to the dimensions of the card cage from an extruded metal element of indeterminate length extruded along a second extrusion axis and each of said rails having a slot therein for receiving and supporting a portion of said support surface.

32. A card cage as recited in claim 31 wherein each of said rails and slots therein are formed of a sufficient length to receive therealong a plurality of edges of supporting surfaces of card holders like said card holder thereby enabling each of said sets of said rails to support a plurality of said card holders.

33. A card cage as recited in claim 27 wherein said side panels are extruded metal members.

34. A card cage as recited in claim 27 wherein said metal card holders include at least one planar member extending transversely from said base and supporting one of said circuit board guides.

* * * * *